United States Patent [19]

Hauck et al.

[11] Patent Number: 4,968,929
[45] Date of Patent: Nov. 6, 1990

[54] PLUG CONNECTOR CODING SYSTEM FOR ELECTRIC CABLES

[75] Inventors: Dieter Hauck, Eberbach; Karl-Heinz May, Viernheim, both of Fed. Rep. of Germany

[73] Assignee: Heidelberger Druckmaschinen AG, Heidelberg, Fed. Rep. of Germany

[21] Appl. No.: 395,299

[22] Filed: Aug. 17, 1989

Related U.S. Application Data

[63] Continuation of Ser. No. 182,934, Apr. 18, 1988, abandoned.

[30] Foreign Application Priority Data

Apr. 18, 1987 [DE] Fed. Rep. of Germany ....... 3713262

[51] Int. Cl.[5] ............................................ G01R 19/00
[52] U.S. Cl. ..................................... 324/66; 324/538; 379/25
[58] Field of Search ................. 324/538, 66, 539, 540, 324/541, 542; 379/25, 12, 21

[56] References Cited

U.S. PATENT DOCUMENTS

| | | | |
|---|---|---|---|
| 2,964,701 | 12/1960 | Argabright | 324/538 X |
| 3,818,329 | 6/1974 | Reaves, Jr. | |
| 3,976,849 | 8/1976 | Champan | 324/538 X |
| 3,982,180 | 9/1976 | Vaiden | |
| 4,218,745 | 8/1980 | Perkins | 324/66 |
| 4,229,691 | 10/1980 | Loesch | 324/538 X |
| 4,326,162 | 4/1982 | Hankey | |

FOREIGN PATENT DOCUMENTS

| | | | |
|---|---|---|---|
| 0087057 | 7/1980 | Japan | 324/538 |
| 155967 | 7/1986 | Japan | 324/66 |
| 0049266 | 3/1987 | Japan | 324/538 |
| 1298350 | 11/1972 | United Kingdom | |
| 2062317 | 5/1981 | United Kingdom | 324/66 |

OTHER PUBLICATIONS

Mattern, "Loose Connector Detection", IBM Technical Disclosure Bulletin vol. 15, No. 1, Jun. 1972, p. 33.

Primary Examiner—Reinhard J. Eisenzopf
Assistant Examiner—Robert W. Mueller
Attorney, Agent, or Firm—Herbert L. Lerner; Laurence A. Greenberg

[57] ABSTRACT

A coding device for an electric cable plug connection having a plug connected to wires of a cable and insertable into a socket, both the plug and the socket being formed with a plurality of contacts, has a coding arrangement for assigning the plug to the socket in a correctly oriented position. The coding arrangement includes at least one jumper link connecting various of the contacts of the socket. The jumper link forms together with the cable connection an electrically interrogatable test loop.

7 Claims, 8 Drawing Sheets

PLUG CONNECTOR CODING SYSTEM FOR ELECTRIC CABLES

This is a continuation of Ser. No. 182,934, filed 4-18-88, now abandoned.

The invention relates to a coding device for an electric cable connector, formed with a plug which is insertable in a socket in a correctly oriented position by means of a coding arrangement.

With technical equipment, a control cabinet or the like often has to be connected electrically to various units of a machine or the like. Such a connection is usually effected by means of cable plug connectors, with the control cabinet and the units being provided with sockets into which the respective plugs of the cable connectors are inserted. These cable plug connections provide increased flexibility in the installation of such equipment.

Especially if a multiplicity of individual cables have to be laid between drawers of the control cabinet and units of the machine there is a greater risk that the plugs may not be inserted into the appropriate sockets therefor, but rather, that unintentional mix-ups may occur. There is a particular risk of this happening if the socket is in the form of a long plug strip which accommodates several plugs side by side. Moreover, in the case of plug connectors symmetrical with respect to a central plane thereof, there is the danger when there is no locating lip or any device for preventing relative rotation between the plug and the socket, that the plug may be inserted the wrong way around, i.e. turned through 180°.

Plug connectors of the general type mentioned in the introduction hereto are known from the field of electrical engineering and have plugs which are provided with numbered tabs formed of plastic material and cooperating with a corresponding coding system on the frame of the socket. These tabs are thus able to be broken off in the vicinity of a nominal breaking point, which affords the possibility of setting different codings which permit only one specific assignment of a given plug to a corresponding socket. This coding system for the cable plug connectors calls for the use of special connecting elements, however, and, moreover, the break-off tabs are relatively sensitive to mechanical influences, so that, if such a tab is broken off by mistake, it is no longer possible to effectuate the assignment set by the coding system. Moreover, the heretofore known coding systems do not permit any monitoring of the plug-in cable connection during the operation of the machine, because, for example, even if a plug of a specific machine unit is pulled out by mistake, no fault message or machine shutdown is triggered by the absence of a correct plug-in connection. Even if, because of the relatively elastic coding tabs and contrary to the mechanical coding system, a plug is inserted by mistake into a socket not suitable for the normal operation of the equipment, electrical connections are produced which may possibly lead to short circuits or destruction of sensitive control equipment. Mechanical coding is unable to prevent such an incorrect or faulty connection with adequate reliability.

It is accordingly an object of the invention to provide a coding device of the foregoing general type, which is able to function with normal plug connectors without special assigning elements. In particular, it is an object of the invention, furthermore, to provide such a coding device which monitors the plug-in connection for electrical integrity, preferably also during operation.

With the foregoing and other objects in view, there is provided, in accordance with the invention, in a coding device for an electric cable plug connection having a plug connected to wires of a cable and insertable into a socket, both the plug and the socket being formed with a plurality of contacts, a coding arrangement for assigning the plug to the socket in a correctly oriented position, the coding arrangement comprising at least one jumper link connecting various of the contacts of the socket, the jumper link forming together with the cable connection an electrically interrogatable test loop. The arrangement may be such that, for example, in the case of the monitoring of a cable plug-in connection formed of two multi-wire cables with appropriate plugs and sockets on the electrical equipment to be connected, the test loop is formed of one wire of one of the cables as well as of another wire of the other cable, and a jumper link connecting the various contacts of the corresponding sockets, these contacts being connected to the wires belonging to the test loop, after the cable connections have been plugged in. What is decisive in this regard is that the contacts are different i.e., for example, if a wire 1 of one cable is connected to contacts 1 and is used for the test loop then, for the other cable, it is necessary to use a wire that is connected to contacts different from the contacts 1 i.e. a wire having a different assignment spatially for the plug and the socket. The numbering of the contacts 1, 2, 3 and so forth is to be understood in this regard as a consecutively numbered designation assigned, in a conventional or customary manner, to the different contacts of a plug-in connection. This test loop according to the invention can then be interrogated from one side of the cable connection to determine whether there is electrical continuity. The use of differently arranged contacts for the input and output of the test loop ensures that the electrical connection of the test loop will be interrupted in the case of an unintentional mix-up of plugs. This can be used, for example, for supplying a signal and for interrupting operation, respectively. It becomes clear from this that, when the test loop is checked also during operation, monitoring of the plug-in connection against the plug being pulled out is also provided.

In accordance with another feature of the invention, the coding device includes a testing device connected to the test loop for feeding a signal representing an electrical change of state into the test loop and for monitoring an output of the test loop with respect to the change of state. If, for example, a digital change of state or condition from "0" to "1" is fed into the input, the output of the test loop will follow suit with this change of state if the cables are properly connected. This decisively increases the reliability of the coding device, because, for example, the feeding-in of a permanent "1-signal" into the input of the test loop does not provide any hundred-percent assurance that, when a "1-signal" is likewise present at the output, there is a correct plug-in connection, because this "output 1-signal" may also come from another circuit that has no points of contact with the coding monitoring system. If, as suggested, however, the change of state is monitored, then it is possible to make a reliable statement on the correct positioning of the plug, should the output signal change with the input signal of the test loop. The same is true for the case wherein changes of state are, in fact, registered yet no synchronization between input signal and output signal exists, in which case there must be an incorrect plug connection.

In accordance with a further feature of the invention, wherein the testing device comprises a switching element connected to an input of the test loop and closes a circuit forming the test loop.

In accordance with an added feature of the invention, the switching element is formed as a transistor.

In accordance with an additional feature of the invention, the testing device includes a driver connected to an output of the test loop. The output of the test loop may thus be interrogated.

In accordance with again another feature of the invention, the coding device includes a test-circuit power source for supplying power to the circuit of the test loop, the power source having one pole thereof connected to the transistor, and the other pole thereof via a load resistance to the output of the test loop.

The test-circuit power source may be a separate power source; alternatively, however, it is also possible to use the normal card power supply of the system as a power source. Through appropriate driving of the transistor, the latter is set to its conducting and non-conducting condition or state, respectively, due to which the test-loop circuit is closed or opened, respectively, a defined test current being obtained depending upon the dimensioning of the load resistance. If the transistor is in its non-conducting state, there will be a defined potential across the load resistance, which, for example, will switch the driver; if the transistor is in its conducting state, there will be a change in the potential across the load resistance, as a result of which the driver connected thereat will likewise be changed to a different state. By means of the testing device, it is possible to monitor the driving and output signals of the coding arrangement, whereby afore-described conclusions with regard to the existing cable plug-in connection are possible.

To automate the testing procedure, in accordance with again a further feature of the invention, the testing device also comprises a driver connected to the output of the test loop, and a microprocessor is connected via a processor-output bus to the transistor for driving the transistor, and connected via a processor-input bus to an output of the driver. An interrogation of the test loop by means of the microprocessor may be effected especially prior to or at each switch-on of the system as a safety check and for monitoring, respectively, and it can also be performed continuously during operation.

In accordance with again an added feature of the invention, the test loop includes two wires of a cable of the plug connection, the wires serving, respectively, as forward and return conductors. This is necessary especially when, for example, a control cabinet is connected to different, electrically separated units, with only one cable connection leading from the control cabinet to each unit. Moreover, apart from the identity check for protection against mix-ups, it is possible, due to the construction of the test loop within a cable, to monitor the plug with respect to its plug-in orientation or positioning round in the socket.

In accordance with again an additional feature of the invention, there are included a plurality of other cables with respective plug connections and wherein the test loop includes various wires of various of the first-mentioned and other cables.

In accordance with yet another feature of the invention, there are included a plurality of other cables with respective plug connections having plugs insertable into respective sockets, each of the sockets being formed with a plurality of contacts, the test loop including a plurality of the jumper links mutually connecting a plurality of the contacts.

In accordance with yet an alternate feature of the embodiments, the last-mentioned contacts are located in different ones or in the same one of the sockets.

This makes it possible, for example, to check a connection formed of three cables wherein the test loop includes a wire of the cable 1, runs via a link between two sockets of the cables 1 and 2, joins another wire of the cable 2 and from there runs, in turn, via a link between the cables 2 and 3 in a wire of the third cable, the end of the test loop being formed by a second wire of the third cable via a further link of the socket of the third cable. An extremely wide range of different configurations is possible in this regard although, in all cases, the basic concept of the invention is utilized.

In accordance with yet an added feature of the invention, a current-limiting circuit is assigned to the transistor for limiting the current of the transistor. This current-limiting circuit limits the collector current of each transistor to a permissible value, with the result that, even if a short circuit occurs, there is no destruction of the transistor.

In accordance with a concomitant feature of the invention, a current-limiting circuit is assigned to the transistor for limiting the current of the transistor, the current-limiting circuit including means for supplying a signal to the microprocessor when a maximum permissible current is reached in the transistor.

The invention is in no way restricted to plug-in cable connections between the aforementioned equipment (control cabinet, machine), but may be applied to any electrical arrangements or devices in which plug-in cable connections are used.

Other features which are considered as characteristic for the invention are set forth in the appended claims.

Although the invention is illustrated and described herein as embodied in a plug connector coding system for electric cables, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
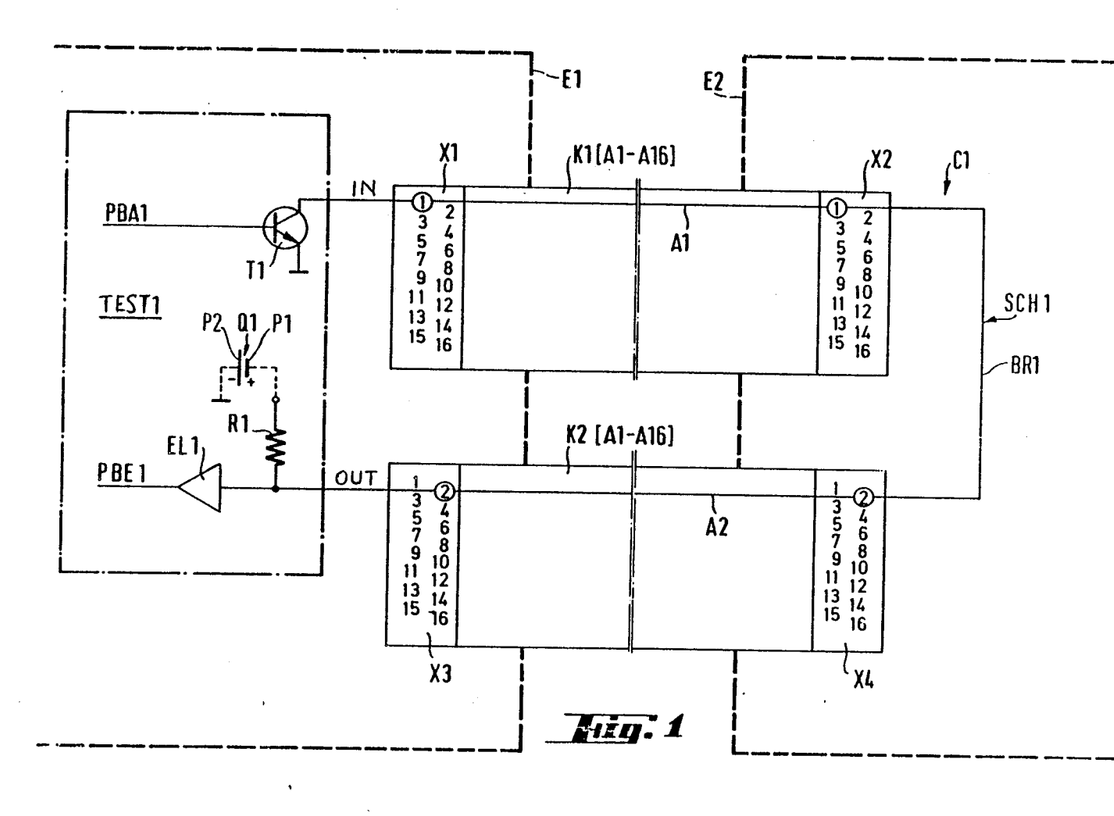
FIG. 1 is a circuit diagram of an electric plug-in cable connection provided with a coding device and formed of two cables respectively having 16-pin plugs at the ends thereof.

Referring now to the drawing and, first, particularly to FIG. 1 thereof, there is shown a unit E1 bounded or enclosed by a broken line as well as a further unit E2 also bounded or enclosed by a broken line. The unit E1 may, for example, be a control cabinet with various slide-in or plug-in drawers, while the unit E2 represents, for example, an electrical device of a printing press. The printing press may be provided with several of such units, for example, one each for the feeder, the printing unit, and so forth.

The units E1 and E2 are connected by cables K1 and K2 via cable connections shown diagrammatically in FIG. 1. The cables K1 and K2 are each 16-wire flat or ribbon cables having at both ends thereof, respectively, connectors X1 to X4, which include suitable plugs on the cable-side thereof, and suitable sockets for the plugs on the unit-side thereof. Plugs and sockets are not shown separately in the diagrammatic representation in FIG. 1.

The connectors X1 to X4, respectively, have contacts 1 to 16 at both the plug and the socket thereof, which can be joined together and have a consecutive numbering from 1 to 16. The number thus corresponds to the number of wires in the cables K1 and K2. The corresponding wires A1 to A16 in the cables K1 and K2 are connected to the identically numbered contacts of the plugs of the cable connectors X1 to X4, although FIG. 1 shows only one wire A1 of the cable K1 and only one wire A2 of the cable K2. The wires A1 and A2 of the cables K1 and K2 do not take part in the conventional connection between the units E1 and E2, but are components of a coding device, by means of which the plug-in cable connections are coded and monitored.

A transistor T1 has a collector which is connected to the contact 1 of the socket of the connector X1 of the unit E1, and has an emitter which is connected to ground i.e. "0" potential. The transistor T1 also has a base which is connected to a processor-output bus PBA1 of an otherwise non-illustrated microprocessor system PBA1. The wire A1 of the cable K1 is connected to the plug contact 1 of the respective connectors X1 and X2. The sockets of the connectors X2 and X4 of the unit E2 are mutually connected by a jumper link BR1. This jumper link BR1 is connected at one end thereof to the contact 1 of the socket of the connector X2 and at the other end thereof to the contact 2 of the socket of the connector X4. The wire A2 of the cable K2 is connected electrically to the plug contacts 2 of the connectors X3 and X4. On the socket side, the contact 2 of the connector X3 is connected to the input of a driver EL1 which has an output forming a connection PBE1 with a processor-input bus of the aforementioned microprocessor system which is not shown in FIG. 1. A load resistance R1 is connected at one end thereof to the input of the driver EL1 and, at the other end thereof, to a pole P1 of a test-circuit power source Q1, which is formed by the normal chart or card power supply of the system. The other pole P2 of the test-circuit power source Q1 is connected to ground i.e. "0" potential. The pole P1 of the test-circuit power source Q1 has the level "1".

As a whole, a coding arrangement C1 is thus formed, which encompasses a test loop SCH1 made up of the wire A1 of the cable K1, the jumper link BR1 and the wire A2 of the cable K2. The transistor T1 is connected to an input IN of the test loop SCH1, while the driver EL1 as well as the load resistance R1 are connected to the output OUT of the test loop SCH1. The transistor T1, the driver EL1, the load resistance R1 as well as the test-circuit power source Q1 and the aforementioned microprocessor system belong to a testing device TEST1. The test loop SCH1 and the testing device TEST1 together form a coding device for the electric cable connectors.

The coding device according to the invention operates as follows: In order to verify whether correct cable connections have been made between the units E1 and E2, the testing device TEST1 feeds a signal via the processor-output bus PBA1 to the transistor T1, due to which the latter is transformed, for example, to the conducting state thereof. Consequently, "0" potential is applied to the input IN of the test loop SCH1, and is, accordingly, also present at the output OUT of the test loop SCH1, as a result of which the input of the driver EL1, which was previously at "1" potential, is set to "0" potential. Accordingly, the output signal of the driver EL1 on the processor-input bus PBE1 changes depending upon whether the driver EL1 inverts or not. In any case, the change of condition fed or applied to the processor-output bus PBA1 by the microprocessor system is suitably inputted again via the processor-input bus PBE1. Due to the tracking or tracing of the change of condition at the processor-input bus PBE1 as a reflection of the input change of condition at the processor-output bus PBA1, the testing device TEST1 is able to determine that there is a correct or proper connection of the cables K1 and K2 between the units E1 and E2.

If the respective plugs of the cables K1 and K2 had been inserted erroneously, for example, into the respective sockets of the connectors X4 and X2, the contact between the wire A2 of the cable K2 and the jumper link BR1, and the wire A1 of the cable K1 and the cable link BR1 would be interrupted, due to which no closed test loop SCH1 would exist, so that an input change of condition of the testing device TEST1 cannot result in a corresponding output change of condition. This can be used, for example, to transmit a signal or to shut down the printing press.

Figure 2:
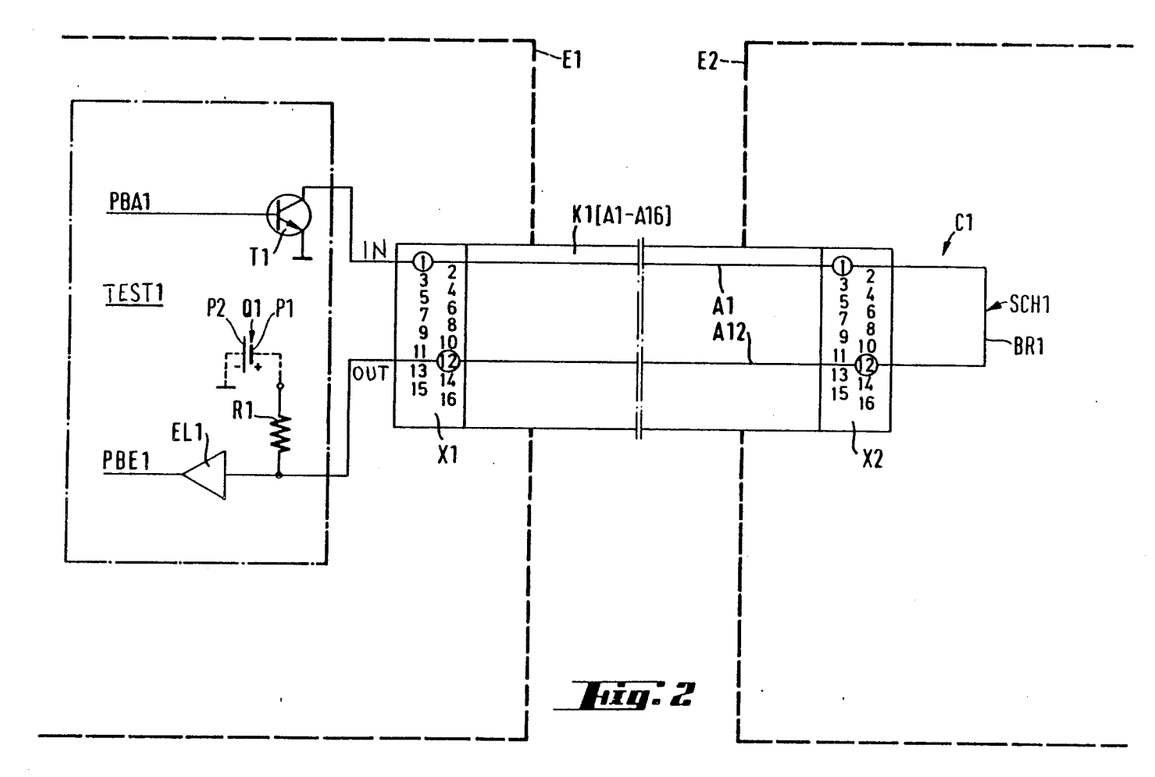
FIG. 2 is a circuit diagram similar to that of FIG. 1, wherein, however, the electrical connection is formed of only one cable.

FIG. 2 shows a coding arrangement C2, which differs from that shown in FIG. 1 in that the test loop SCH1 includes two wires A1 and A12 of one and the same cable K1. This cable K1 connects the electrical unit E1 to the electrical unit E2 via the connectors X1 and X2. The arrangement in FIG. 2 is meaningful, for example, if several units like the unit E1 are connected to several units like the unit E2, respectively, via a cable connection with appropriate plugs and sockets. In order to ensure that the respective appropriate unit E1 is connected to the corresponding unit E2, each plug-in cable connection is monitored by a coding arrangement like the coding arrangement C2.

For this purpose, the transistor T1 of the testing device TEST1 is connected to the wire A1 of the cable K1, and the contacts 1 and 12 of the connector X2 are connected to the ends of the jumper link BR1. The wire A12 of the cable K1 which, in turn, is connected to the jumper link BR1, leads to the load resistance R1 and to the input of the driver EL1. Altogether, therefore, the test loop SCH1 is formed by the wires A1 and A12 of the cable K1 and the jumper link BR1.

The manner of operation of the circuit arrangement shown in FIG. 2 is the same as that of FIG. 1 and will therefore not be described again herein. In order to be able to trace or locate an exchange or substitution of cable connections between the afore-described number of units E1 and number of units E2, it is obviously necessary that, for each cable connection between the corresponding units, different wires of the connecting cable K1 be used in order to form the corresponding test loop SCH1. Only when a faulty connection occurs will the corresponding test loop be interrupted, a fact which, in turn, can be detected by the testing device TEST1.

Figure 3:
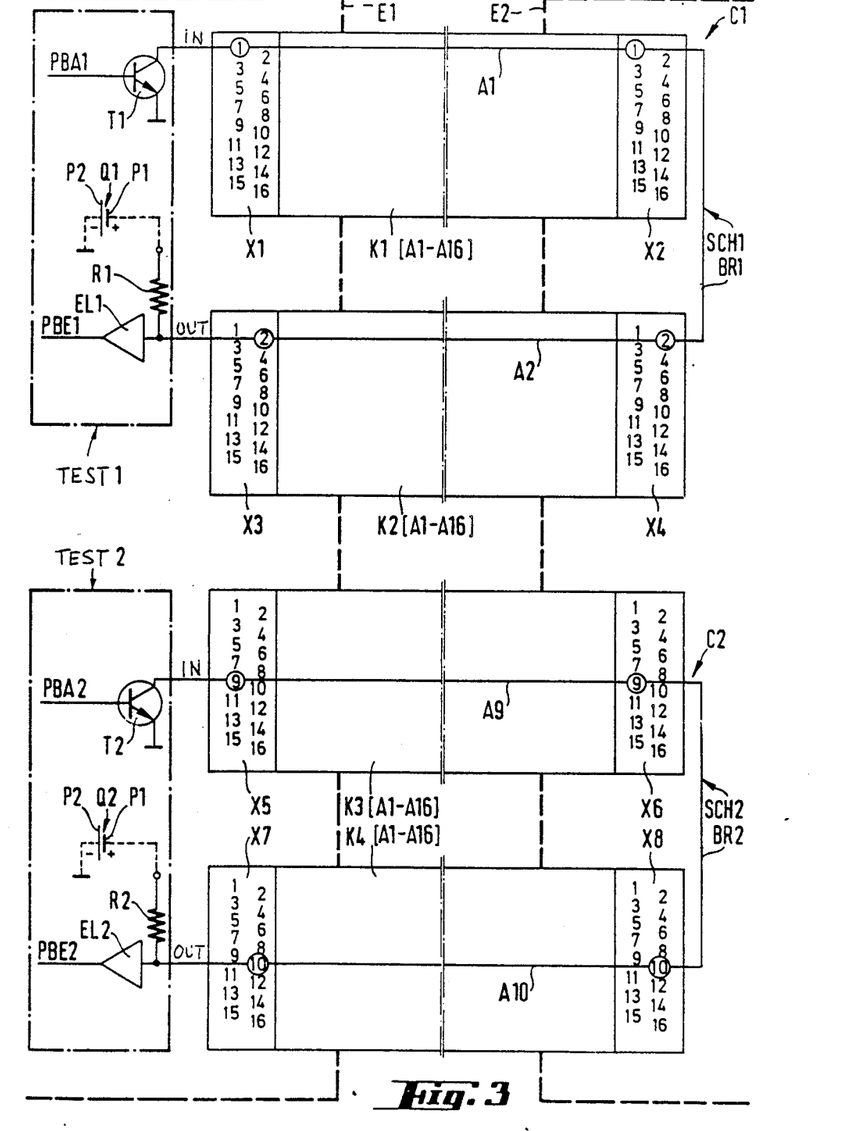
FIG. 3 is a circuit diagram, reduced in size, similar to that of FIG. 1 wherein the plug-in connection is formed of four cables and the coding device thereof forms two test loops.

FIG. 3 illustrates a further exemplary embodiment of the invention in which the units E1 and E2 are connected by four cables K1, K2, K3 and K4 in all. The respective plug-in connections are identified by reference characters X1 to X8. The cables K1 and K2 form the test loop SCH1, and cables K3 and K4 form a test loop SCH2. The test loop SCH1 is formed of the wire 1 of the cable K1, the jumper link BR1 and the wire A2 of the cable K2. The test loop SCH2 is formed of a wire A9 of the cable K3, a jumper link BR2 and a wire A10 of the cable K4. Just as in the exemplary embodiments described hereinbefore, the two test loops SCH1 and SCH2 are connected to testing means which, in this case, because there are two test loops SCH1 and SCH2, are formed of two testing devices TEST1 and TEST2, both controllable, however, by the same microprocessor system. A coding arrangement C1 is formed with the aid of the test loop SCH1, and a coding arrangement C2 is formed with the aid of the test loop SCH2. The coding arrangement C1 of FIG. 3 operates just like the one shown in FIG. 1. This applies as well to the coding arrangement C2 shown in FIG. 3. Thus, respective pairs of the cables K1 and K2, on the one hand, and K3 and K4, on the other hand, are each monitored with regard to their plug-in connections. Assurance must, of course, be provided that a different wire be selected in each cable for forming the corresponding test loop, so that, in the event of an unintentional exchange or substitution of the cable connections, an interruption of the corresponding test loop is reliably assured.

Figure 4:
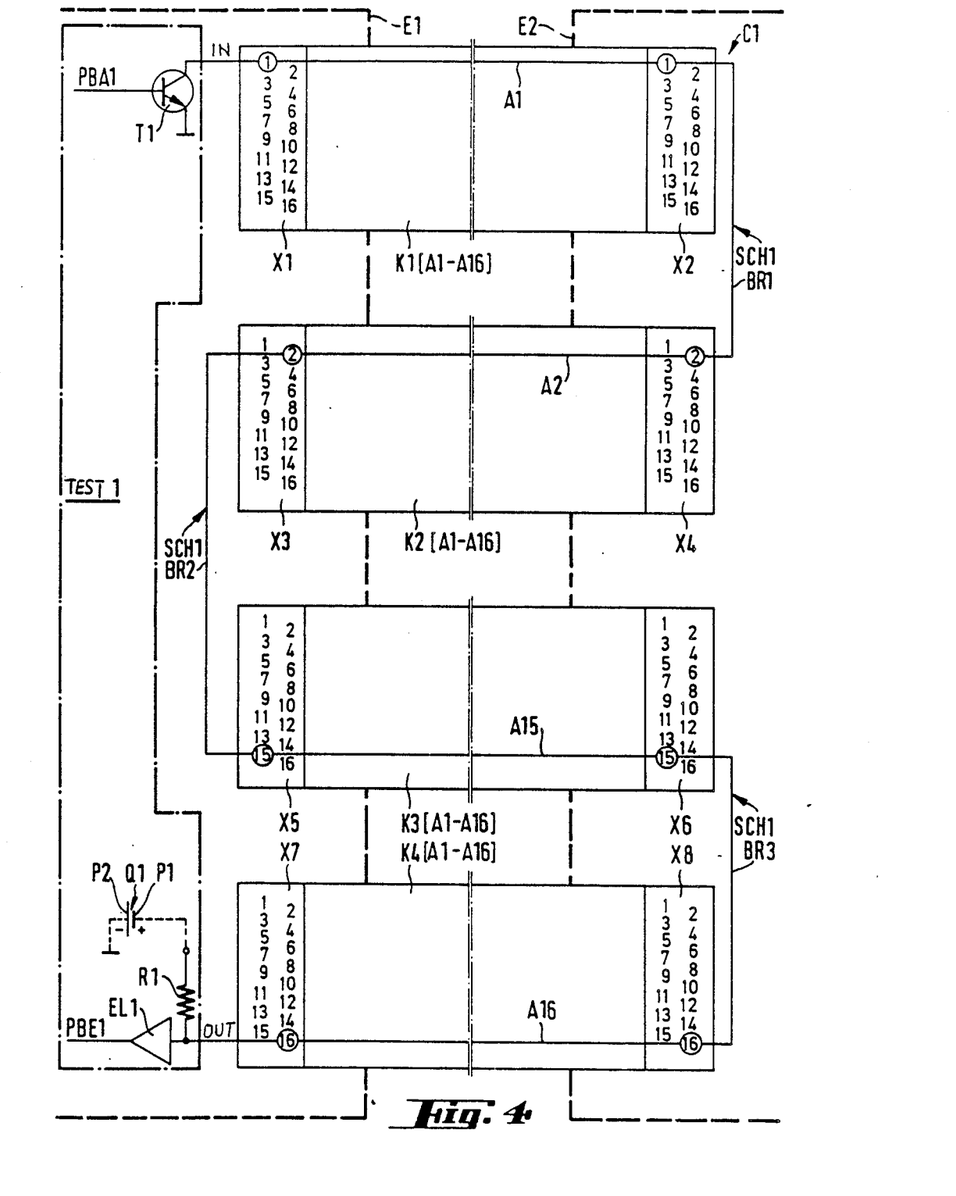
FIG. 4 is a circuit diagram of a cable connection similar to that of FIG. 3, but with only one test loop which includes a total of three jumper links.

A further exemplary embodiment of the invention is represented in FIG. 4 and, as in FIG. 3, shows the connection of the units E1 and E2 by means of the four cables K1 to K4. In this case, however, differing from the embodiment shown in FIG. 3, there is only one testing device TEST1, and the test loop SCH1 which is developed encompasses three jumper links BR1, BR2 and BR3 in all.

More specifically, the setup or construction of the embodiment of FIG. 4 is as follows: The transistor T1 of the testing device TEST1 is connected to the contact 1 of the socket of the connector X1. The wire A1 of the cable K1 mutually connects the contacts 1 of the connectors X1 and X2. The contact 1 of the connector X1 and the contact 2 of the connector X4 are mutually connected by the jumper link BR1. The wire A2 of the cable K2 connects the contact 2 of the connector X4 to the contact 2 of the connector X3. The jumper or cable link BR2 is located between the contact 2 of the connector X3 and the contact 15 of the connector X5. The wire A15 of the cable K3 mutually connects the contact 15 of the connector X5 and the contact 15 of the connector X6. The jumper link BR3 mutually connects the contact 15 of the connector X6 and the contact 16 of the connector X8, and the wire A16 of the cable K4 connects the contacts 16 of the connectors X8 and X7. Connected to the contact 16 of the connector X7 are the load resistance R1 and the driver EL1 of the testing device TEST1. Therefore, the thus formed test loop SCH1 is made up of the wire A1 of the cable K1, the jumper link BR1, the wire 2 of the cable K2, the jumper link BR2, the wire 15 of the cable 3, the jumper link BR3 and the wire 16 of the cable 4. It should be noted in this connection, as a modification to the aforementioned exemplary embodiments, that the jumper links are not all in the same unit, but rather, are found both in the unit 1 and in the unit 2 in this case. According to FIG. 4, the test loop SCH1 has a meandering appearance.

The manner of operation of the exemplary embodiment shown in FIG. 4 is the same as of that in FIG. 1, so that if the cable connections are correct, a change of condition fed into the test loop SCH1 must occur again at the output of the test loop SCH1, which is registered accordingly by the testing device TEST1. Once again, it should be noted that different wires are used in each case for the different cables K1 to K4, so that a closed test loop SCH1 is formed only in the case of a quite specific configuration. The selected wires A1, A2, A15 and A16 have been chosen at random; it is, of course, also possible to use other wires.

According to another non-illustrated embodiment, it is also possible for the coding connections to be made in matrix form, which reduces the outlay or expense for the test lines in the case of a very large number of connections. Furthermore, additional wiring precautions may be provided in order to prevent short circuits, in which regard, for example, the respective transistors T1 and T2 may be provided with a current-limiting device CL and send a signal to the processor system if the maximum current load is reached. The current-limiting device may be in the form of a current-limiting circuit associated with the transistors T1 and T2. This arrangement has the advantage that, for example, in the case of the device shown in FIG. 1, the wire A2 of the cable K1, and the wire A1 of the cable K2 need not be kept free, but rather, may be used for normal signal transmission. If the plugs are unintentionally interchanged or mixed up, a signal which may thereby act on the transistor T1 cannot cause that transistor to be destroyed because of an impermissibly high collector current. On the contrary, the current-limiting circuit limits the collector current to a permissible value. An additional possibility for locating a fault or failure is thus created by the aforementioned signal sent to the processor system.

If outputs as well as inputs are routed via the cable connections between the units E1 and E2, and the outputs have potentials which are capable of causing damage to the electrical equipment if an incorrect connection should result from an unintentional interchange or mix-up of the plugs, the aforementioned current-limiting device will prevent short circuits by being so constructed as to prevent the occurrence of the aforementioned damage. These current-limited short circuits may occur whenever there is an incorrect cable connection between the units E1 and E2. Due to the aforementioned sending of a signal to the processor system, the test may be aborted immediately, in the event of an occurrence of a current-limited short circuit. The aforementioned current-limiting system has the advantage that the wires of the cables connected to contacts but not required for the test loop or loops can be used for the connection of both inputs and outputs.

Figure 5:
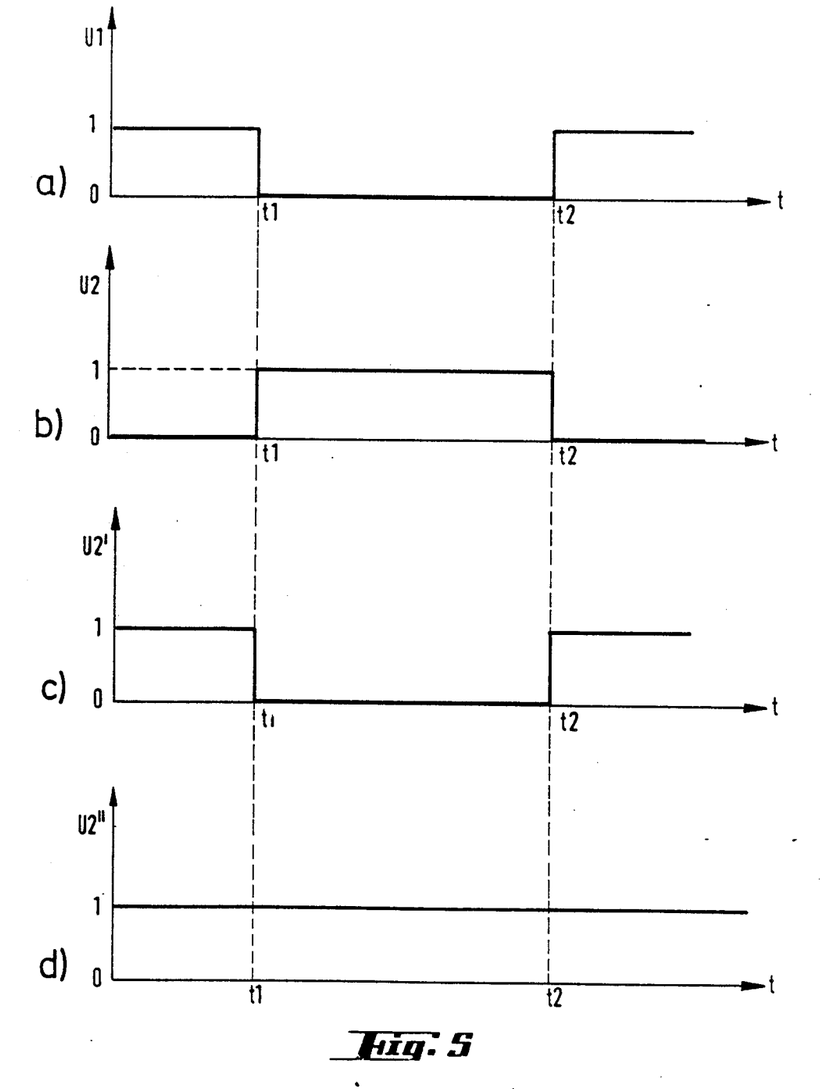
FIG. 5 contains plot diagrams of input and output signals of the test loop.

FIGS. 5 a to d are various voltage/time graphs. There is plotted in FIG. 5a a voltage U1 at "1" potential which is applied to the input IN of the test loop SCH1 until the time t1 when the transistor T1 is in the non-conducting state or condition. As of the time t1, a change in condition or state occurs due to the energization or triggering of the transistor T1, with the result that the collector thereof is set to "0" potential. This state continues until the time t2. Then, the transistor T1 returns to its non-conducting state, with the result that the voltage U1 rises again to "1" potential. The same voltage characteristics as shown in the curve of FIG. 5a are present at the output OUT of the test loop SCH1.

FIG. 5b illustrates the characteristics of the output voltage U2 of the driver EL1 shown in FIG. 1, it being assumed that the driver EL1 supplies an output signal which is inverted with respect to its input. This means that, as of the time t1 i.e. when the transistor T1 is energized or triggered, the output signal U2 of the driver EL1 rises to a specific potential. This potential is maintained until the time t2 and falls again, for example to 0, as of the time at which the transistor T1 returns to its non-conducting state. It becomes clear that, at the times t1 and t2, there are corresponding changes of condition in the voltages U1 and U2 from which the testing devices TEST1 and TEST2, respectively, draw the conclusion that a correct cable connection exists.

In FIG. 5c, there is shown a voltage U2', which is present at the output of the driver EL1 when the latter is of the non-inverting type. To this extent, the voltage characteristics of U1 are identical with those of U2'.

FIG. 5d presents a voltage U2'', which is applied to the output of the driver EL1 shown in FIG. 1 when cable connections have been inadvertently interchanged or mixed up i.e. when the test loop SCH1 is not closed. If the voltage U1 is fed into the input IN of the test loop SCH1, under these circumstances, the change of condition or state cannot be transmitted to the input of the driver EL1. A permanent "1" potential from the test-circuit power source Q1 via the load resistance R1 is applied to the driver EL1, which results in a permanent output voltage U2'' if the driver EL1 is of the non-inverting type. The testing device TEST1 concludes therefrom that the the cable connection is faulty.

Figure 6:
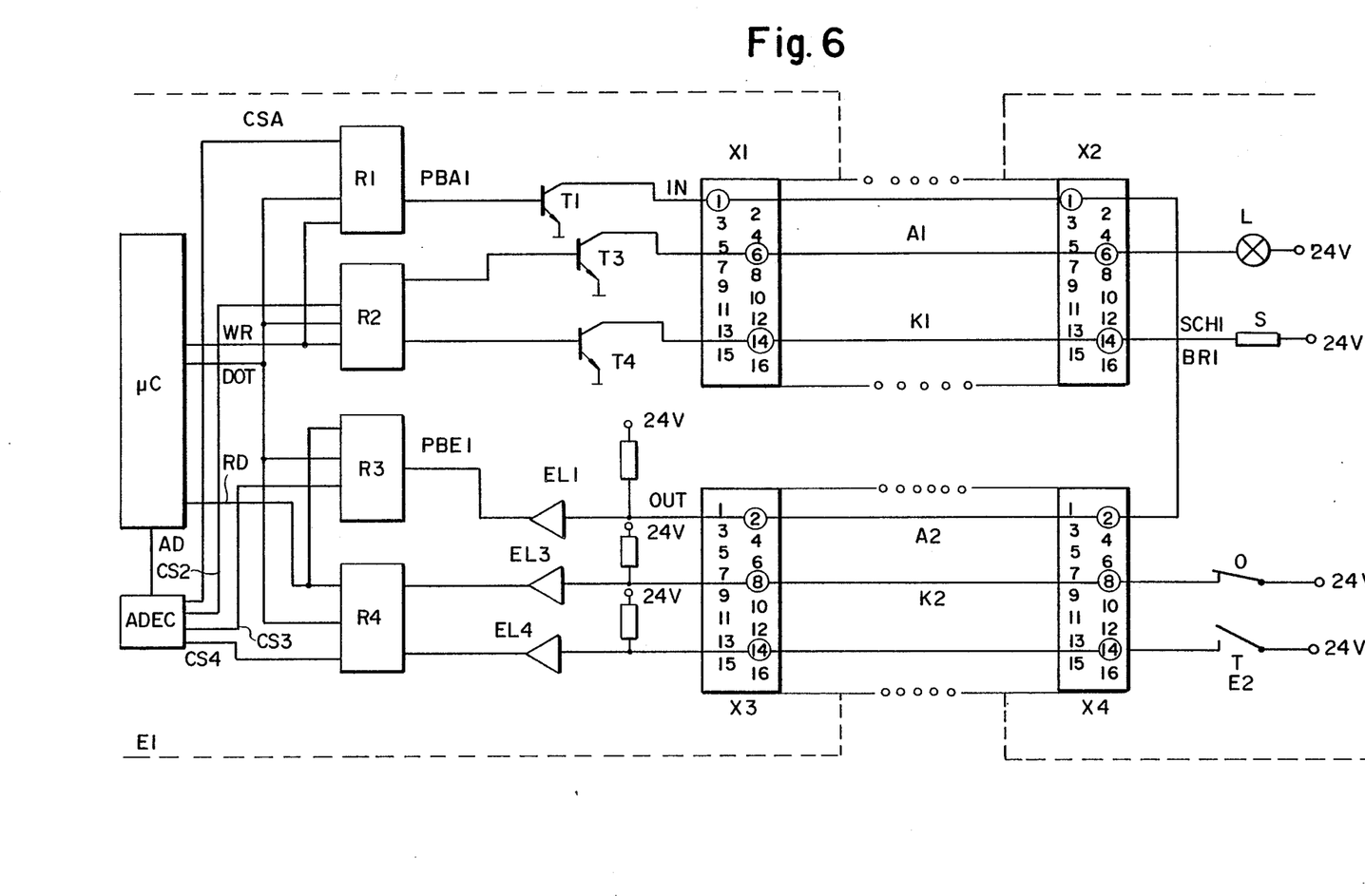
FIG. 6 is a block diagram showing the units E1 and E2 in greater detail with correct connections to the scanner and the microprocessor.

In the block circuit diagram of FIG. 6, the plug connections X1 and X3 are shown connected to a microprocessor system with which the unit E1 is associated while the plug connections X2 and X4 are connected to a printing machine with which the unit E2 is associated.

As is readily apparent from FIG. 6, an address bus AD of a microcomputer MC is connected to an address decoding system ADEC which, via chip or module selections CS1 to CS4, selects a respective register R1 to R4. A data bus also connects the microcomputer MC to the registers R1 and R2, and a read bus connects the registers R3 and R4 to the microcomputer MC. Processor output buses PBA1 and the like, respectively, connect the register R1 to the transistor T1, and the register R2 to transistor T3 and T4, while processor input buses PBE1 and the like, are respectively, connected from the driver EL1 to the register R3, and from drivers EL3 and EL4 to the register R4. The transistor T1 is connected to an input at contact 1 of the plug connection X1 and via the wire A1 of the cable K1 to the contact 1 of the plug connection X2 and, in the test loop SCH1 via the jumper link BR1 to a contact 2 of the plug connection X4, and via a wire A2 of the cable K2 to a contact 2 of the plug connection X3 forming an output to the driver EL1. The transistor T3 is connected, in turn, to a contact 6 of the plug connection X1 and, via a wire of the cable K1, to a contact 6 of the plug connection X2 which is connected to a lamp L energized by a 24-v source. In turn, the transistor T4 is connected to a contact 14 of the plug connection X1 and via a wire of the cable K1, to a contact 14 of the plug connection X2 which is connected via a fuse S to a 24-v energy source. An opener 0, for example, a terminal switch protective wire grid, connects a 24-v energy source via a contact 8 of the plug connection X4, a wire of the cable K2 and a contact 8 of the plug connection X3 to the input driver EL3. A closer T, for example, key operation, in turn, connects a 24-v energy source via a contact 14 of the plug connection X4, a wire of the cable K2 and a contact 14 of the plug connection X3 to the input driver EL4.

Figure 7:
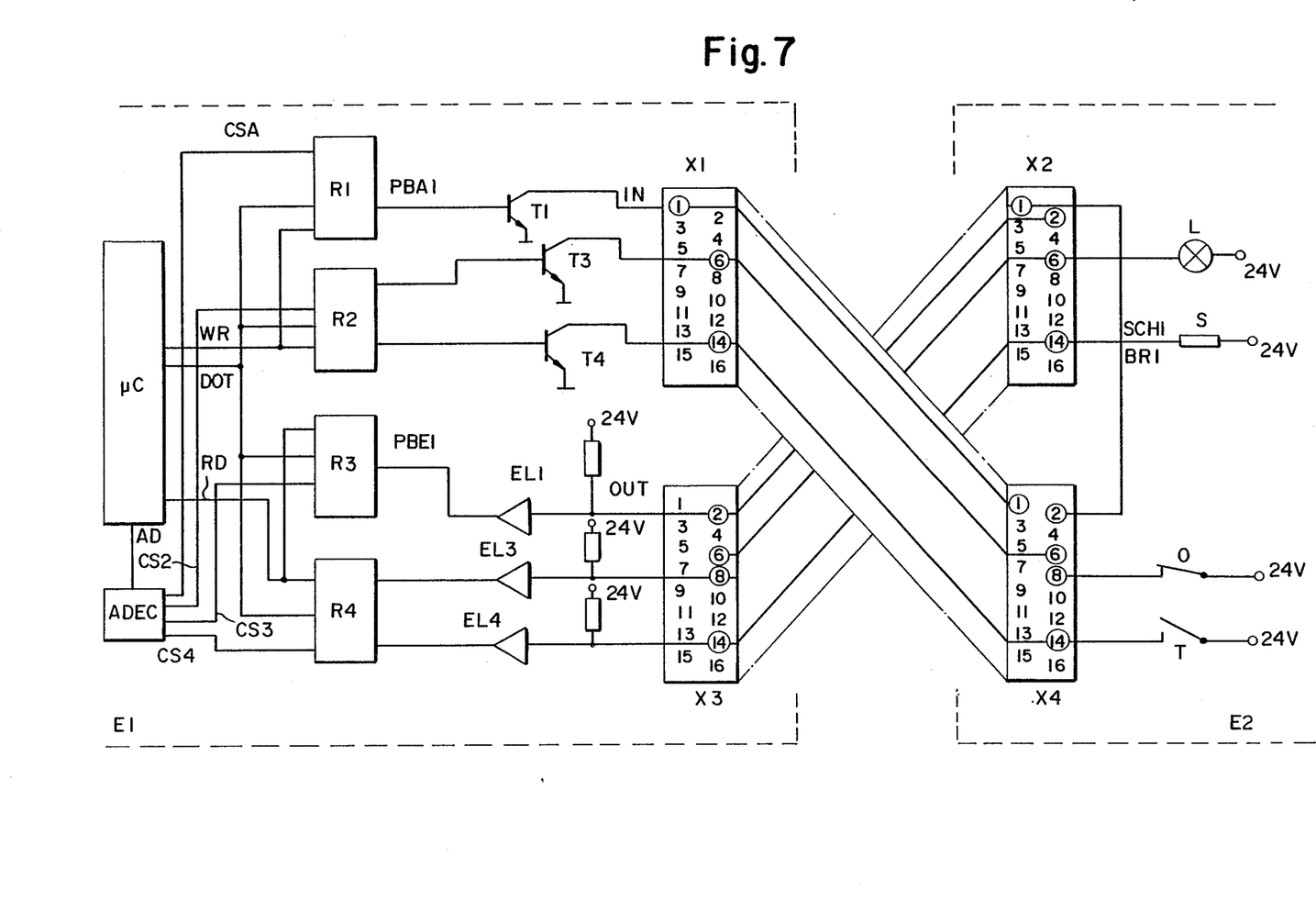
FIG. 7 is a block diagram like that of FIG. 6 with incorrect connections to the scanner and the microprocessor.

FIG. 7 is a block circuit diagram having a configuration similar to that of FIG. 6 except that the plug of the connection X2 has incorrectly been plugged into the socket of the connection X4, and the plug of the connection X4 has been plugged in incorrectly into the socket of the connection X2. Thus whereas the block diagram of FIG. 6 represents a correct plug-in arrangement, the block diagram of FIG. 7 represents an incorrect or faulty plug-in arrangement. With respect to FIG. 7, it is noted that the test loop SCH1 is not closed therein. When such is the case, no output drivers T3 and T4 may be driven. If T4 were to become conductive, actuation of the key T would disrupt the output driver T4.

Figure 8:
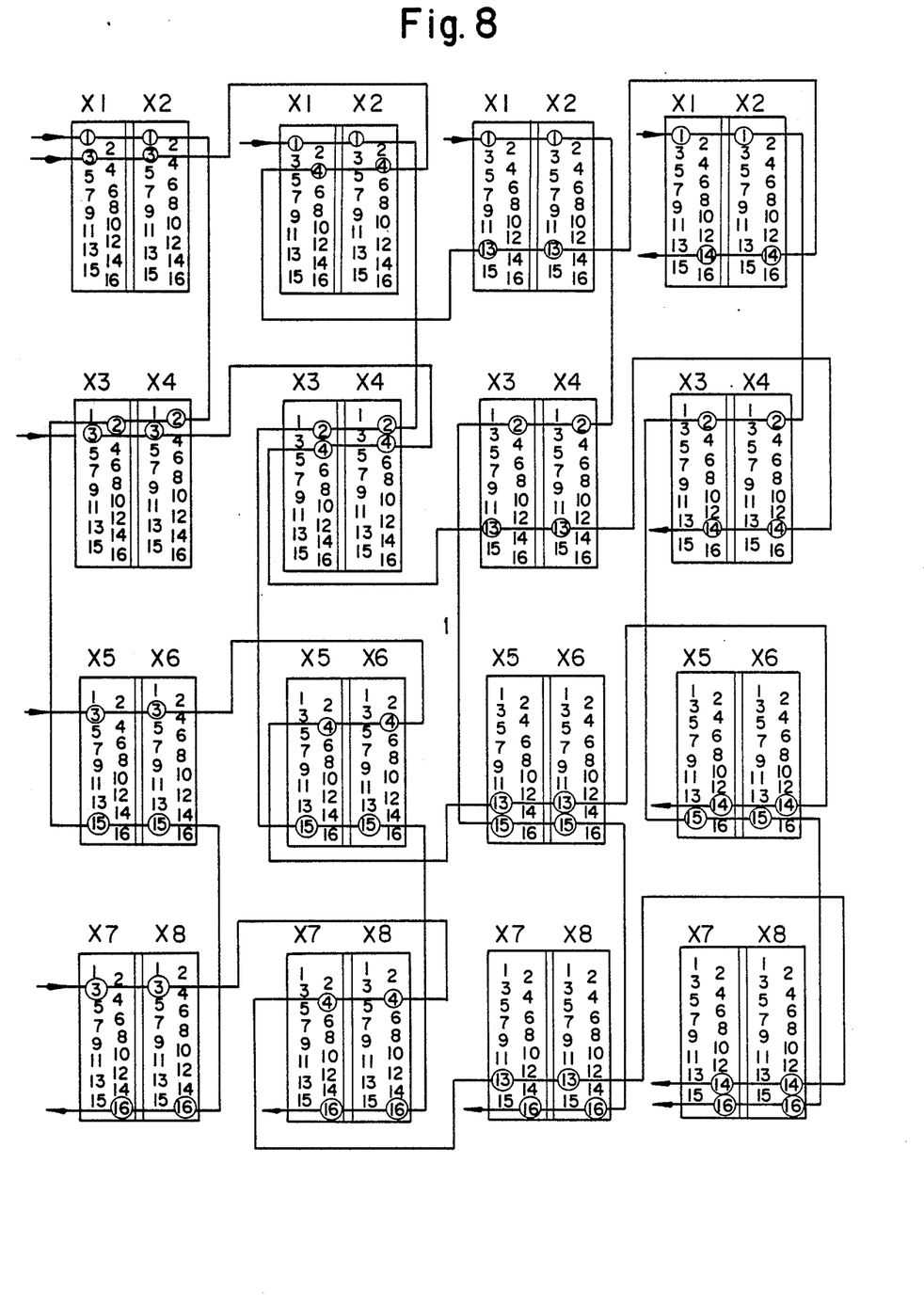
FIG. 8 is a diagrammatic view of the matrix arrangement of the test loops for sixteen connections of the bridges.

FIG. 8 is a diagrammatic view of a matrix arrangement of the test loops for sixteen contact connections. Links on the left-hand and lower side of the plugs shown therein are realized in regard to the unit E1, whereas the links at the right-hand and upper side of the plugs shown therein are realized in regard to the unit E2.

We claim:

1. In a coding device for an electric cable plug connection having a plug connected to wires of a cable and insertible into a socket, both the plug and the socket being formed with a plurality of contacts, a coding arrangement for assigning the plug to the socket in a correctly oriented position, the coding arrangement comprising at least one jumper link connecting various of the contacts of the socket, said jumper link forming together with the cable connection an electrically interrogatable test loop, a testing device connected to said test loop for feeding a signal representing an electrical change of state into the test loop and for monitoring an output of said test loop with respect to the change of state, wherein said testing device comprises a switching element connected to an input of said test loop and closing a circuit forming said test loop, said switching element is formed as a transistor, said testing device also comprises a driver connected to said output of said test loop, and including a microprocessor connected via a processor-output bus to said transistor for driving said transistor, and connected via a processor-input bus to an output of said driver and including a current-limiting circuit assigned to said transistor for limiting the current of said transistor, said current-limiting circuit including means for supplying a signal to said microprocessor when a maximum permissible current is reached in said transistor.

2. Coding device according to claim 1, including a test-circuit power source for supplying power to said circuit of said test loop, said power source having one pole thereof connected to said transistor, and the other pole thereof via a load resistance to said output of said test loop.

3. Coding device according to claim 1, wherein said test loop includes two wires of a cable of the plug connection, said wires serving, respectively, as forward and return conductors.

4. Coding device according to claim 1, including a plurality of other cables with respective plug connections and wherein said test loop includes various wires of various of said first-mentioned and other cables.

5. Coding device according to claim 1 including a plurality of other cables with respective plug connections having plugs insertable into respective sockets, each of said sockets being formed with a plurality of contacts, said test loop including a plurality of said jumper links mutually connecting a plurality of said contacts.

6. Coding device according to claim 5 wherein said last-mentioned contacts are located in different ones of said sockets.

7. Coding device according to claim 5 wherein said last-mentioned contacts are located in the same one of said sockets.

* * * * *